(12) United States Patent
Chen et al.

(10) Patent No.: US 11,887,791 B2
(45) Date of Patent: Jan. 30, 2024

(54) KEY MODULE

(71) Applicants: LITE-ON ELECTRONICS (GUANGZHOU) LIMITED, Guangzhou (CN); Lite-On Technology Corporation, Taipei (TW)

(72) Inventors: Jian-Jhih Chen, Taipei (TW); Ming-Fu Yen, Taipei (TW); Wei-Pin Chuang, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 235 days.

(21) Appl. No.: 16/903,368

(22) Filed: Jun. 16, 2020

(65) Prior Publication Data

US 2020/0402740 A1 Dec. 24, 2020

Related U.S. Application Data

(60) Provisional application No. 62/912,074, filed on Oct. 8, 2019, provisional application No. 62/863,251, filed on Jun. 18, 2019.

(30) Foreign Application Priority Data

May 25, 2020 (CN) .......................... 202010448535.0

(51) Int. Cl.
*H01H 13/14* (2006.01)
*H01H 13/02* (2006.01)
(Continued)

(52) U.S. Cl.
CPC .......... *H01H 13/14* (2013.01); *H01H 13/023* (2013.01); *H01H 13/10* (2013.01);
(Continued)

(58) Field of Classification Search
CPC ...... H01H 13/14; H01H 13/023; H01H 13/10; H01H 2219/06; H01H 2219/062;
(Continued)

(56) References Cited

U.S. PATENT DOCUMENTS 10,600,591 B2 * 3/2020 Chiang .................. H01H 13/83
2009/0251384 A1 * 10/2009 Ligtenberg ........... H01H 13/705
200/344

(Continued)

FOREIGN PATENT DOCUMENTS

CN 107644766 1/2018

OTHER PUBLICATIONS

"Office Action of China Counterpart Application", dated Sep. 21, 2022, p. 1-p. 7.

*Primary Examiner* — Lheiren Mae A Caroc
(74) *Attorney, Agent, or Firm* — JCIPRNET

(57) ABSTRACT

A key module includes a bottom plate, a circuit layer, a key cap, a supporting structure, a touch member, and a flexible circuit board. The bottom plate has a first surface and a second surface opposite to each other. The circuit layer is disposed on the first surface and has a first opening. The key cap is disposed above the circuit layer and covers the first opening. The supporting structure is disposed between the bottom plate and the key cap. The touch member is disposed at the key cap. The flexible circuit board is electrically connected to the touch member and passes through the first opening to extend next to the second surface of the bottom plate. When the key cap moves downward relative to the bottom plate, a portion of the flexible circuit board located between the key cap and the bottom plate is bent.

11 Claims, 9 Drawing Sheets

(51) Int. Cl.
*H01H 13/10* (2006.01)
*H03K 17/969* (2006.01)

(52) U.S. Cl.
CPC ....... *H03K 17/969* (2013.01); *H01H 2219/06* (2013.01); *H01H 2219/062* (2013.01)

(58) Field of Classification Search
CPC .. H01H 3/125; H01H 2239/022; H01H 13/02; H01H 13/04; H03K 17/969
See application file for complete search history.

(56) References Cited

U.S. PATENT DOCUMENTS

| | | |
|---|---|---|
| 2012/0306752 A1 | 12/2012 | Hosoya et al. |
| 2014/0118264 A1* | 5/2014 | Leong ..................... G06F 3/021 |
| | | 200/310 |

* cited by examiner

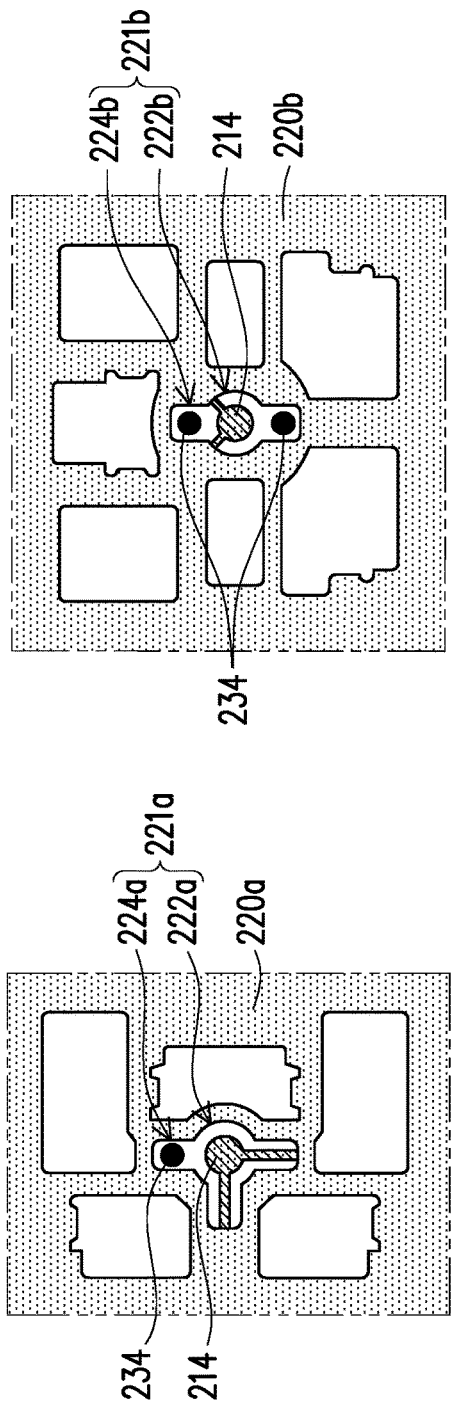
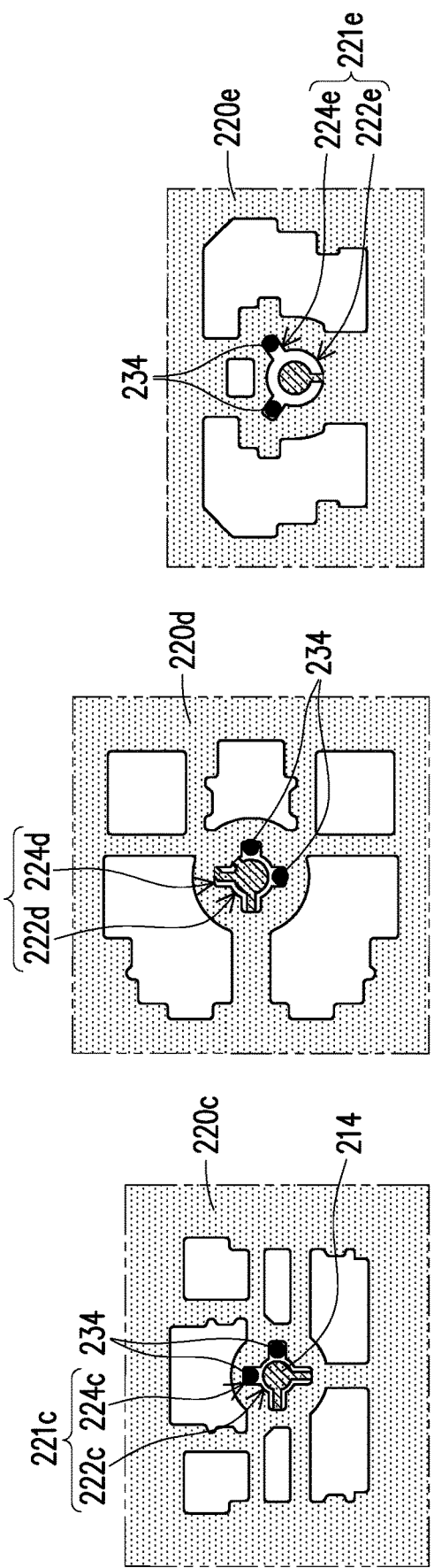

KEY MODULE

CROSS-REFERENCE TO RELATED APPLICATION

This application claims the priority benefits of U.S. provisional application Ser. No. 62/863,251, filed on Jun. 18, 2019, U.S. provisional application Ser. No. 62/912,074, filed on Oct. 8, 2019, and China application serial no. 202010448535.0, filed on May 25, 2020. The entirety of each of the above-mentioned patent applications is hereby incorporated by reference herein and made a part of this specification.

BACKGROUND

Technical Field

The disclosure relates to a key module.

Description of Related Art

With the advancement of technology, functions to be provided by keyboard keys become more and more diverse. How to provide various input options on a keyboard is an important issue. Besides, in an existing light-emitting keyboard, the backlight module of the light-emitting keyboard is mainly based on the combination of the side-emitting light sources and the light guide plate at present. Light emitting may be provided to the keys of the entire light-emitting keyboard at once, but light emitting may not be exclusively provided to specific keys.

SUMMARY

The disclosure provides a key module including a touch member.

The disclosure provides a key module including an independent light source.

In a key module according to an embodiment of the disclosure, a bottom plate, a circuit layer, a key cap, a supporting structure, a touch member, and a flexible circuit board are included. The bottom plate has a first surface and a second surface opposite to each other. The circuit layer is disposed on the first surface of the bottom plate, and the circuit layer has a first opening. The key cap is disposed above the circuit layer. The touch member is exposed from the key cap. The supporting structure is disposed between the bottom plate and the key cap. The flexible circuit board is electrically connected to the touch member and passes through the first opening of the circuit layer to extend next to the second surface of the bottom plate, wherein a portion of the flexible circuit board located between the key cap and the bottom plate is bent when the key cap moves downward relative to the bottom plate.

In a key module according to an embodiment of the disclosure, a bottom plate, a circuit layer, a key cap, and a backlight assembly are included. The bottom plate includes a first hole, and the first hole includes a central region and at least one branch region extending from the central region. The circuit layer is disposed on the bottom plate and has a second hole corresponding to the first hole. The circuit layer includes a triggering switch, and the triggering switch is aligned with the central region of the first hole of the bottom plate. The key cap is disposed above the circuit layer and covers the first hole and the second hole. The supporting structure is disposed between the bottom plate and the key cap. The backlight assembly is disposed below the bottom plate and includes a circuit board and at least one light source disposed on the circuit board. The key cap covers the at least one light source, and the at least one light source is aligned with the at least one branch region of the first hole of the bottom plate. Light emitted by the at least one light source passes through the first hole and the second hole and is transmitted toward the key cap.

To sum up, the key module provided by the embodiments of the disclosure is provided with the touch member disposed at the key cap, so that dual input options, including pressing and touching, are provided. The circuit layer electrically connected to the touch member is provided with the first opening covered by the key cap, such that the flexible circuit board may pass through the first opening of the circuit layer to extend next to the second surface of the bottom plate. In this way, the flexible circuit board electrically connected to the touch member may not be exposed, and a favorable appearance and a protection effect are thereby provided. In addition, in the embodiments of the disclosure, the bottom plate and the circuit layer of the key module are respectively provided with a first hole and a second hole covered by the key cap. The light source of the backlight assembly is covered by the key cap. The light emitted by the light source passes through the first hole and the second hole and is transmitted toward the key cap, such that the key module may act as an independent light-emitting key module.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 8A to FIG. 8I are schematic views of relative position relationships among a bottom plate, a triggering switch, and light sources according to the embodiments of the disclosure.

DESCRIPTION OF THE EMBODIMENTS

Figure 1:
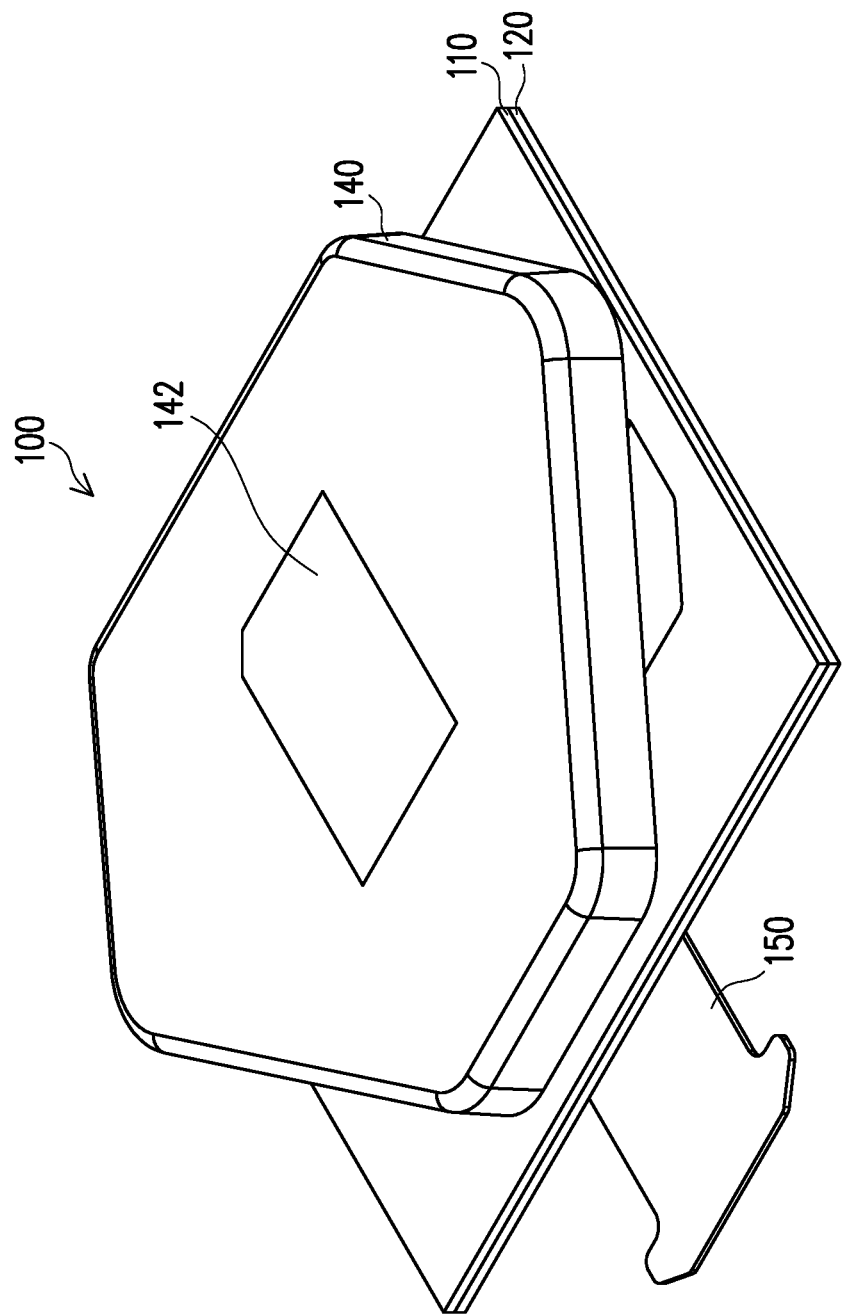
FIG. 1 is a schematic view of a key module according to an embodiment of the disclosure.

Descriptions of the disclosure are given with reference to the exemplary embodiments illustrated by the accompanying drawings. Wherever possible, the same reference numbers are used in the drawings and the description to refer to the same or like parts.

Figure 2:
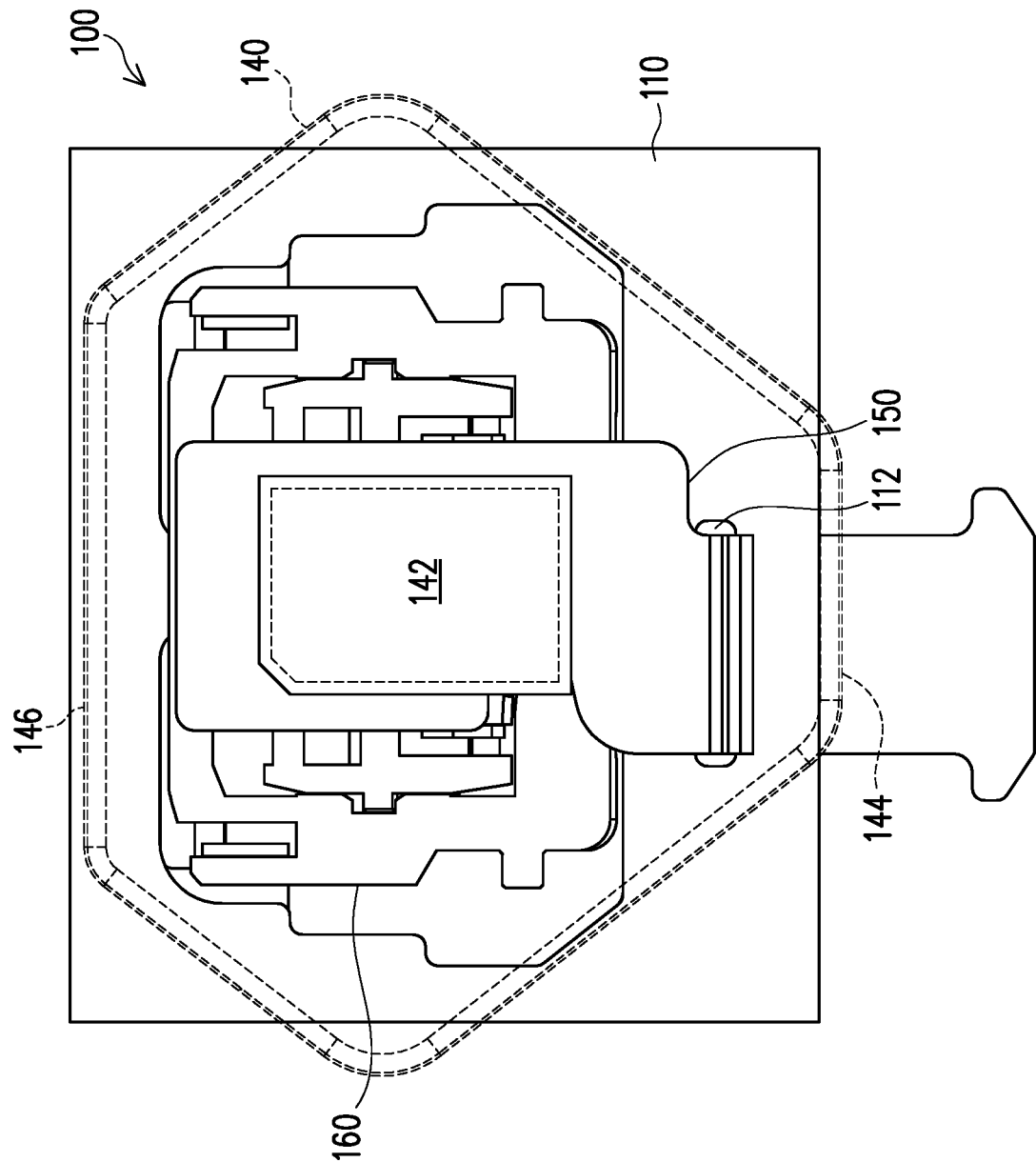
FIG. 2 is a schematic top view of the key module of FIG. 1 in which a key cap is depicted by dotted lines.

FIG. 1 is a schematic view of a key module according to an embodiment of the disclosure. With reference to FIG. 1, in this embodiment, a key module may be applied to, for example, a keyboard, but is not limited thereto. In this embodiment, a key module 100 includes a bottom plate 120, a circuit layer 110, a key cap 140, a touch member 142, a flexible circuit board 150, and a supporting structure 160 (FIG. 2). As shown in FIG. 1, the touch member 142 is exposed from the key cap 140, such that the key module may further provide a touch function in addition to a data input function provided through pressing. For instance, the touch member 142 may be configured to determine information such as a finger movement direction or clicking. Certainly, in other embodiments, the touch member 142 may feature a capacitive design, and the touch member 142 is located below the key cap 140 rather than being exposed from the key cap 140. Positional arrangement and types of the touch member 142 are not limited herein.

Note that in order to allow a signal on the touch member 142 to be transmitted to a main board (not shown), the touch member 142 is connected to the flexible circuit board 150, such that the electrical signal may be transmitted to the main board through the flexible circuit board 150. The key module 100 of this embodiment features a special design through which a bending length of the flexible circuit board 150 is decreased and a space may be reserved for the motion performed by the flexible circuit board 150, such that the flexible circuit board 150 is prevented from causing signal attenuation owing to an excessively long length and from causing interference with other devices. Description thereof is provided as follows.

Figure 3:
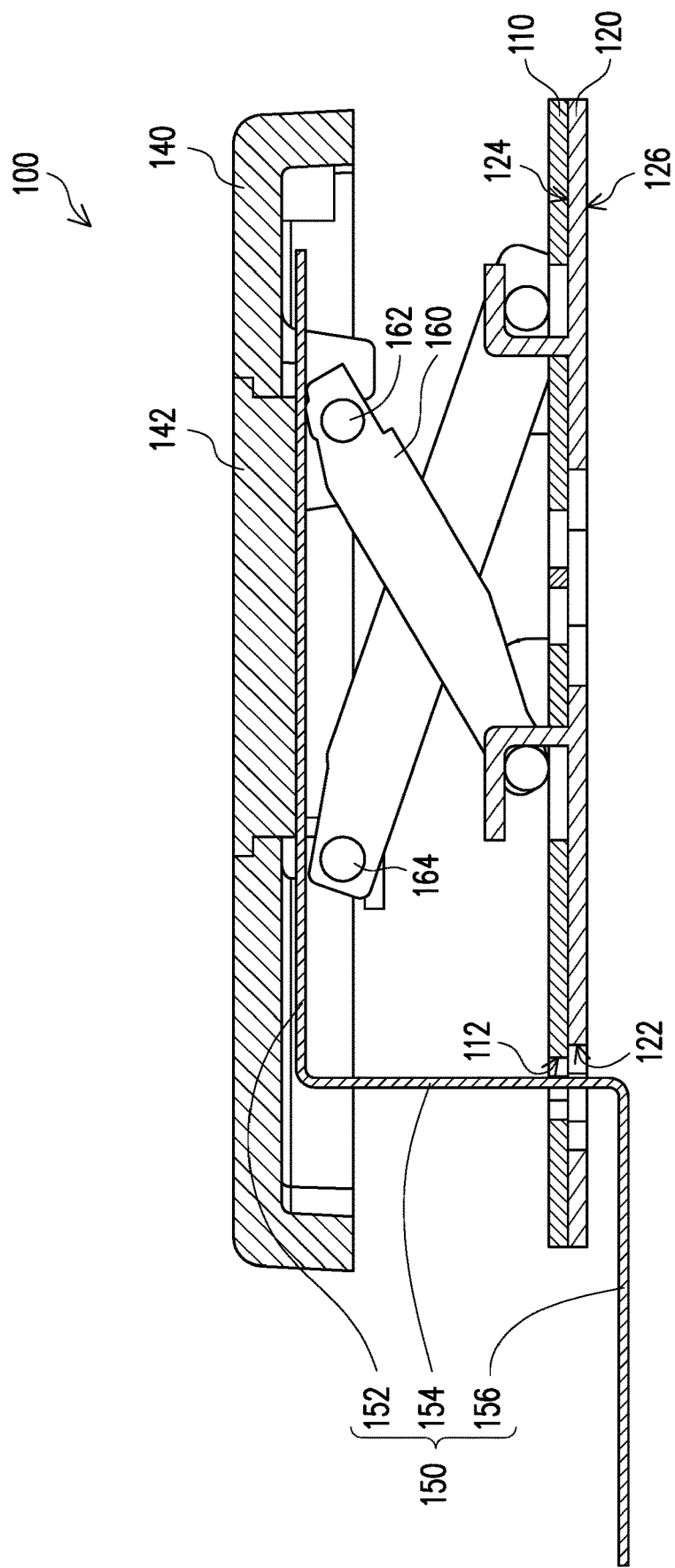
FIG. 3 is a schematic cross-sectional view of the key module of FIG. 1 before being pressed.
Figure 4:
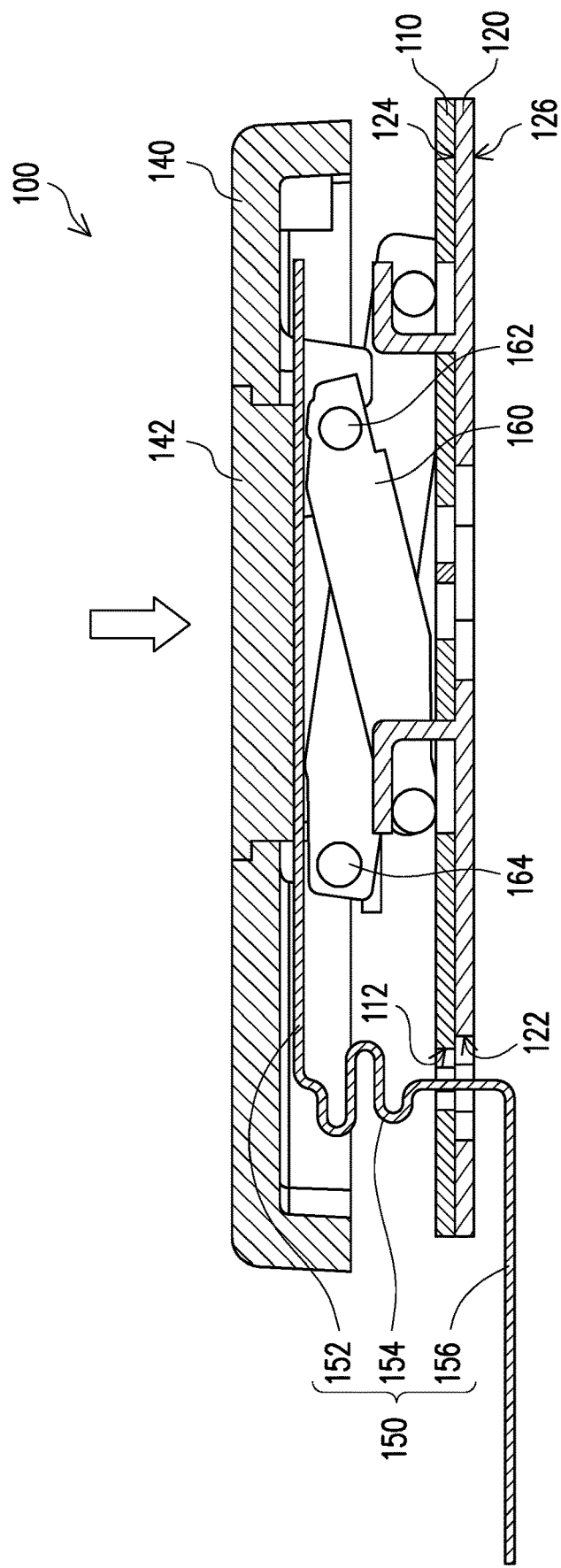
FIG. 4 is a schematic cross-sectional view of the key module of FIG. 1 when being pressed.

FIG. 2 is a schematic top view of the key module of FIG. 1 in which the key cap is depicted by dotted lines. FIG. 3 is a schematic cross-sectional view of the key module of FIG. 1 before being pressed. FIG. 4 is a schematic cross-sectional view of the key module of FIG. 1 when being pressed.

With reference to FIG. 2 to FIG. 4, in the present embodiment, the bottom plate 120 has a first surface 124 (FIG. 3) and s second surface 126 (FIG. 3) opposite to each other. In this embodiment, the first surface 124 is, for example, an upper surface, and the second surface 126 is, for example, a lower surface, but the relative position between the first surface 124 and the second surface 126 is not limited thereto. The circuit layer 110 is disposed on the first surface 124 of the bottom plate 120. The flexible circuit board 150 includes, for example, a copper foil substrate or an etching circuit membrane (TCM), but types of the flexible circuit board 150 are not limited thereto. The key cap 140 is disposed above the circuit layer 110. The supporting structure 160 is disposed between the bottom plate 120 and the key cap 140, such that the key cap 140 may move up and down horizontally during the up and down movement. As shown in FIG. 3, a fixing end 162 of the supporting structure 160 is pivotally connected to the key cap 140 and may rotate relative to the key cap 140. A sliding end 164 of the supporting structure 160 is slidably disposed at the key cap 140 and may rotate and move relative to the key cap 140.

In this embodiment, in order to allow the flexible circuit board 150 electrically connected to the touch member 142 to be prevented from being exposed and seen by a user, the circuit layer 110 is deliberately provided with a first opening 112 covered by the key cap 140. In this way, the flexible circuit board 150 may directly pass through the first opening 112 of the circuit layer 110 below the key cap 140 to extend next to the second surface 126 of the bottom plate 120.

As shown in FIG. 3, in the present embodiment, the flexible circuit board 150 includes a first segment 152, a second segment 154, and a third segment 156 connected in sequence in a bent manner. The first segment 152 horizontally extends along an inner surface of the key cap 140. The second segment 154 vertically extends in a direction from the key cap 140 toward the circuit layer 110 and passes through the first opening 112 of the circuit layer 110 and the second opening 122 of the bottom plate 120. The third segment 156 is located next to the second surface 126 of the bottom plate 120 and horizontally extends along the second surface 126.

As shown in FIG. 4, in this embodiment, a sufficient space is provided between the key cap 140 and the bottom plate 120 for the second segment 154 of the flexible circuit board 150 to perform deformation. Therefore, when the key cap 140 moves downward relative to the bottom plate 120, a portion of the flexible circuit board 150 located between the key cap 140 and the bottom plate 120 (that is, the second segment 154) is bent, not the third segment 156. In this way, circuits on the flexible circuit board 150 may not be pulled or broken when the flexible circuit board 150 is deformed. Note that the position of the first opening 112 may be determined by the position of the main board. The first opening 112 may be located at one side closest to the main board in a range of the circuit layer 110 covered by the key cap 140, such that the length of the flexible circuit board 150 may be decreased to prevent signal attenuation from occurring. Certainly, arrangement of the first opening 112 is not limited thereto. Besides, a width of the first opening 112 is, for example, at least twice as large as the flexible circuit board 150, such that a sufficient space is provided for the flexible circuit board 150 to slightly slide or deform when the key cap 140 moves downward.

With reference to FIG. 2 again, in this embodiment, the supporting structure 160 is located above and near the key cap 140. That is, in FIG. 2, the supporting structure 160 is located on the upper center of the key cap 140, not the center. Specifically, the key cap 140 includes a first side edge 144 and a second side edge 146 opposite to each other. The first side edge 144 is close to the first opening 112, and the second side edge 146 is away from the first opening 112. A distance between the supporting structure 160 and the first side edge 142 is greater than a distance between the supporting structure 160 and the second side edge 144. Such design is provided in this embodiment because the circuit layer 110 is provided with the first opening 112 allowing the flexible circuit board 150 to pass through and the key cap 140 extends in a direction toward the first opening 112 and thereby covers the first opening 112 to provide a complete appearance.

Figure 5:
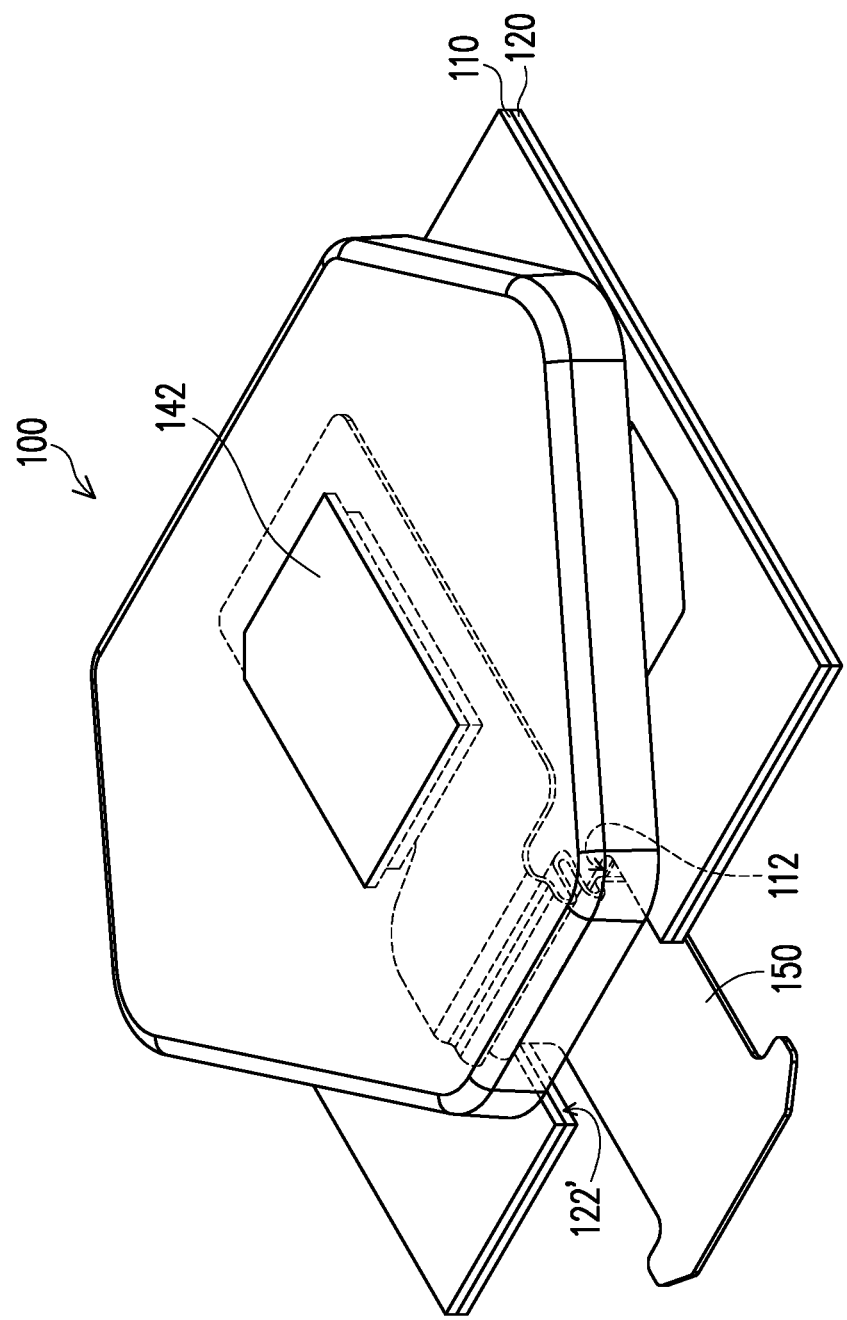
FIG. 5 is a schematic view of the key module according to another embodiment of the disclosure.

As shown in FIG. 3, in the present embodiment, the bottom plate 120 further includes a second opening 122 corresponding to the first opening 112. The second opening 122 is covered by the key cap 140. The flexible circuit board 150 passes through the first opening 112 of the circuit layer 110 and the second opening 122 of the bottom plate 120 to extend to the second surface 126. In this embodiment, the second opening 122 is located at a non-edge portion of the bottom plate 120, that is, the second opening 122 has an enclosed annular shape. FIG. 5 is a schematic view of the key module according to another embodiment of the disclosure. With reference to FIG. 5, in this embodiment, the first opening 112 and a second opening 122' may also be non-enclosed annular shape structures recessed at an edge of the circuit layer 110 and an edge of the bottom plate 120 respectively. Forms of the first opening 112 and the second opening 122' are not limited to the illustration shown in the drawing.

Figure 6:
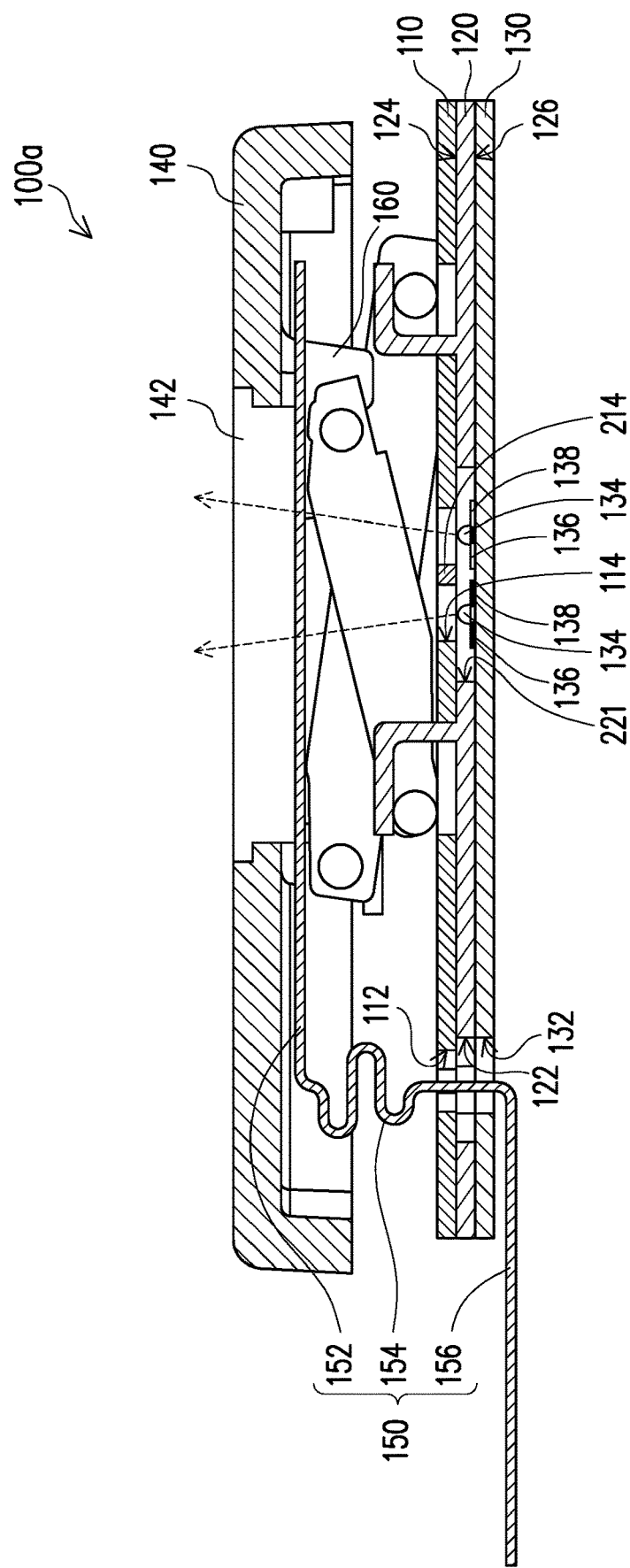
FIG. 6 is a schematic cross-sectional view of a key module according to another embodiment of the disclosure.
Figure 7:
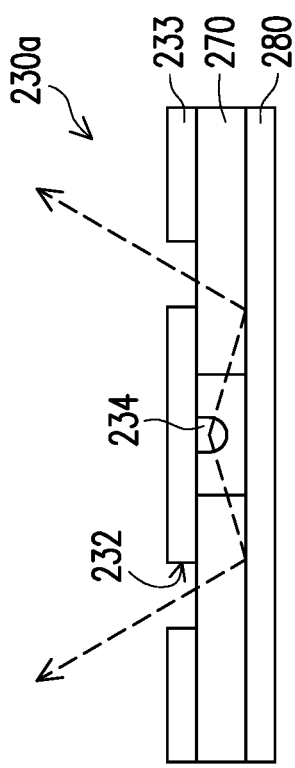
FIG. 7 is a schematic cross-sectional view of a backlight module according to another embodiment of the disclosure.

As shown in FIG. 6 and FIG. 7, when the key cap 140 is pressed and thus moves downward, the portion of the flexible circuit board 150 located between the key cap 140 and the bottom plate 120 is bent. Since this portion of the flexible circuit board 150 is away from the supporting structure 160, this portion may not generate interference with the supporting structure 160, so that the key cap 140 may move up and down smoothly.

Note that in this embodiment, one portion of the flexible circuit board 150 (e.g., the portion located above) may be fixed to a lower surface of the key cap 140, and another portion of the flexible circuit board 150 (e.g., the portion located below) may be fixed to a housing (not shown) or the main board. In this way, the flexible circuit board 150 presents three portions of horizontal, vertical, and horizontal from top to bottom, and an angle of 90 degrees is included between two adjacent portions among the three portions. Certainly, in other embodiments, the angle included between two adjacent portions among the three portions is not limited thereto.

In addition, if this segment of the flexible circuit board 150 between the key cap 140 and the bottom plate 120 is the only segment that is not fixed and is movable, when the key cap 140 is pressed and moves downward, only this segment of the flexible circuit board 150 may be bent under such design. A designer may remove devices next to this segment of the flexible circuit board 150, so as to ensure that interference may not occur during pressing. Certainly, in other embodiments, a fixed portion of the flexible circuit board 150 is not limited thereto. In other embodiments, a lowermost horizontal portion of the flexible circuit board 150 may also be movable.

FIG. 6 is a schematic cross-sectional view of a key module according to another embodiment of the disclosure. With reference to FIG. 6, in this embodiment, a key module 100a is a light-emitting key module and exhibits a light-emitting key function. The key module 100a further includes a backlight assembly 130 disposed below the second surface 126 of the bottom plate 120. The backlight assembly 130 includes a third opening 132 corresponding to the first opening 112. The third opening 132 is covered by the key cap 140. In this embodiment, the first opening 112, the second opening 122, and the third opening 132 are aligned with one another. The flexible circuit board 150 passes through the first opening 112 of the circuit layer 110, the second opening 122 of the bottom plate 120, and the third opening 132 of the backlight assembly 130 to extend toward a bottom surface of the backlight assembly 130.

Similarly, in the key module 100a provided by this embodiment, portions of the circuit layer 110, the bottom plate 120, and the backlight assembly 130 covered by the key cap 140 are designed to be provided with the first opening 112, the second opening 122, and the third opening 132 respectively. In this way, the flexible circuit board 150 connected to the touch member 142 exposed from the key cap 140 may pass through these openings, so that the flexible circuit board 150 is not exposed, and a favorable appearance and a protection function are provided. The first opening 112, the second opening 122, and the third opening 132 may be close to the main board, such that the flexible circuit board 150 may exhibit a reduced length, and signal attenuation is thereby prevented and costs are lowered.

In addition, in this embodiment, the key module 100a may be applied to, for example, a keyboard, but is not limited thereto. In a conventional light-emitting keyboard, the light sources are side-emitting light sources, so the light sources are usually not located directly under key caps and provide light to the entire row of keys. In this embodiment, light sources of the key module 100a are light sources 134 providing upward-emitting light and are capable of providing light required by a single key module 100a.

The backlight assembly 130 includes a circuit board and the light sources 134 disposed on the circuit board, and circuits 136 and 138 are disposed on the circuit board. The light sources 134 are electrically connected to the circuits 136 and 138. The light sources 134 are, for example, mini LEDs or micro LEDs, but types of the light sources 134 are not limited thereto.

The light sources 134 are located below the key cap 140. That is, the key cap 140 covers the light sources 134. In addition, in this embodiment, a first hole 221 is disposed on the bottom plate 120, and a second hole 114 is disposed on the circuit layer 110 and corresponds to the first hole 221. The circuit layer 110 includes a triggering switch 214, and the triggering switch 214 is aligned with the first hole 221 of the bottom plate 120. The light sources 134 are located in the first hole 221 of the bottom plate 120 and keep away from the triggering switch 214. Light emitted by the light sources 134 passes through the first hole 221 of the bottom plate 120 and the second hole 114 of the circuit layer 110 and is transmitted toward the key cap 140. Therefore, in this embodiment, the key module 100a may independently emit light and function as a single key, such that the requirement for independent light is satisfied. Besides, in this embodiment, the light sources 134 are lower than a surface of the bottom plate 120 facing the key cap 140, such that an entire thickness is not affected.

Certainly, forms of the backlight assembly 130 are not limited to the above. FIG. 7 is a schematic cross-sectional view of a backlight module according to another embodiment of the disclosure. With reference to FIG. 7, in this embodiment, a backlight assembly 230a further includes a light guide plate 270 and a reflection plate 280. The light guide plate 270 is located between the circuit board 233 and the reflection plate 280, and the light source 234 is disposed on a surface of the circuit board 233 facing the light guide plate 270. That is, the light source 234 is located on a lower surface of the circuit board 233. In this embodiment, the circuit board 233 includes a third hole 232 covered by the key cap 240, and light emitted by the light source 234 passes through the third hole 232 of the circuit board 233, the bottom plate 120 (FIG. 6), and the circuit layer 110 (FIG. 6) and is transmitted toward the key cap 140 (FIG. 6) after being reflected by the reflection plate 280.

Figure 8H:
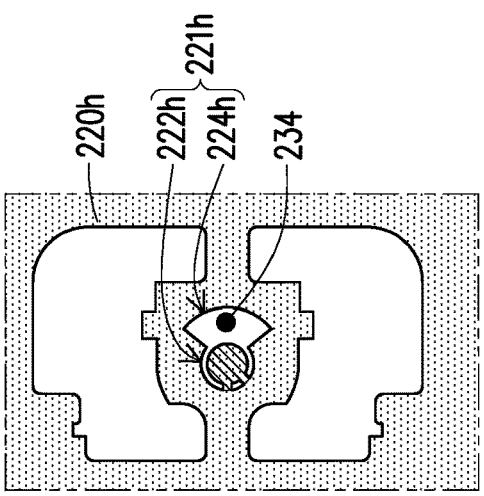

FIG. 8A to FIG. 8I are schematic views of relative position relationships among a bottom plate, a triggering switch, and light sources according to the embodiments of the disclosure. With reference to FIG. 8A first, a first hole 221a includes a central region 222a and branch regions 224a extending from the central region 222a, the triggering switch 214 is aligned with the central region 222a, and the light source 234 is aligned with the branch regions 224a. That is, in this embodiment, the light source 234 is located at a position near a center of the bottom plate 220a, but the positions of the light source 234 and the triggering switch 214 are staggered. The at least one light source 234 is aligned with at least one of the branch regions 224a, and a trace of the triggering switch 214 is aligned with the rest of the branch regions 224a. Certainly, relative positions among the bottom plate 220a, the triggering switch 214, and the light source 234 are not limited thereto. In FIG. 8A, the number of the branch regions 224a is three, the light source 234 is located in one of the branch regions 224a, and traces of the triggering switch 214 may extend to the other two branch regions 224a. An included angle between any two adjacent branch regions 224a ranges between 90° and 180°.

In FIG. 8B, the number of branch regions 224b of a first hole 221b of a bottom plate 220b is two, the branch regions 224b are disposed up and down, and the number of the light sources 234 is two as well. The triggering switch 214 is aligned with a central region 222b, and the two light sources 234 are respectively aligned with and located in the two branch regions 224b. A trace of the triggering switch 214 is not aligned with the branch regions 224b.

In FIG. 8C, the number of branch regions 224c of a first hole 221c of a bottom plate 220c is four, and the number of the light sources 234 is two. The triggering switch 214 is aligned with a central region 222c. The two light sources 234 are respectively located in the two branch regions, and the traces of the triggering switch 214 may extend to the other two branch regions 224c.

In FIG. 8D, the number of branch regions 224d of a first hole 221d of a bottom plate 220d is four. The two light sources 234 are located in the two branch regions 224d on the right and below. The triggering switch 214 is aligned with a central region 222d, and the traces of the triggering switch 214 extend to the two branch regions 224d on the left and above.

In FIG. 8E, the number of branch regions 224e of a first hole 221e of a bottom plate 220e is two, the branch regions 224e extend in upper left and upper right directions, and the number of the light sources 234 is two as well. The triggering switch 214 is aligned with a central region 222e, and the two light sources 234 are respectively located in the two branch regions 224e.

Figure 8G:
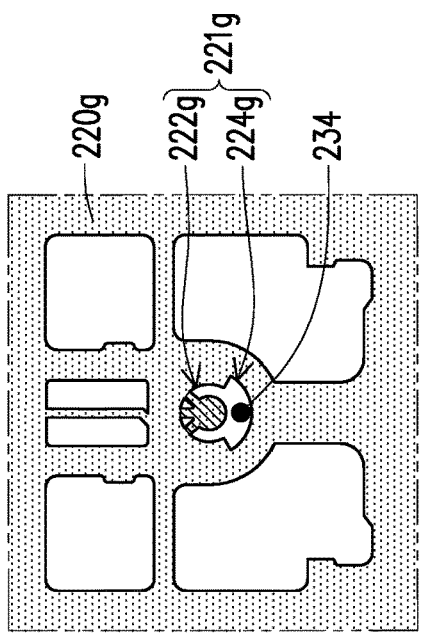
Figure 8F:
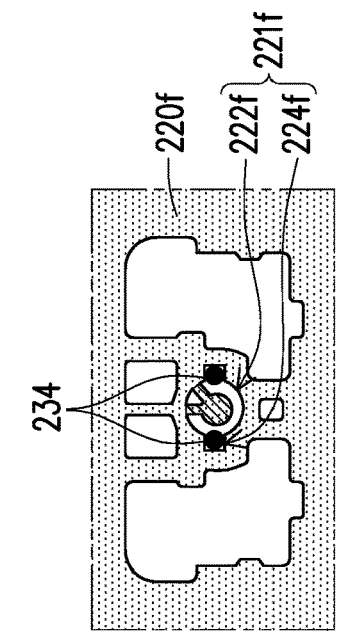

In FIG. 8F, the number of branch regions 224f of a first hole 221f of a bottom plate 220f is two, the branch regions 224e extend in left and right directions, and the number of the light sources 234 is two as well. The triggering switch 214 is aligned with a central region 222f, and the two light sources 234 are respectively located in the two branch regions 224f.

In FIG. 8G, the number of a branch region 224g of a first hole 221g of a bottom plate 220g is one, the branch region 224g is fan-shaped and is located below a central region 222g, and the number of the light source 234 is one. The triggering switch 214 is aligned with the central region 222g, and the light source 234 is located in the branch region 224g. In the embodiment, the branch region 224g is a sector shaped region.

In FIG. 8H, the number of a branch region 224h of a first hole 221h of a bottom plate 220h is one, the branch region 224h is fan-shaped and is located to the right of a central region 222h, and the number of the light source 234 is one. The triggering switch 214 is aligned with the central region 222h, and the light source 234 is located in the branch region 224h.

Figure 8I:
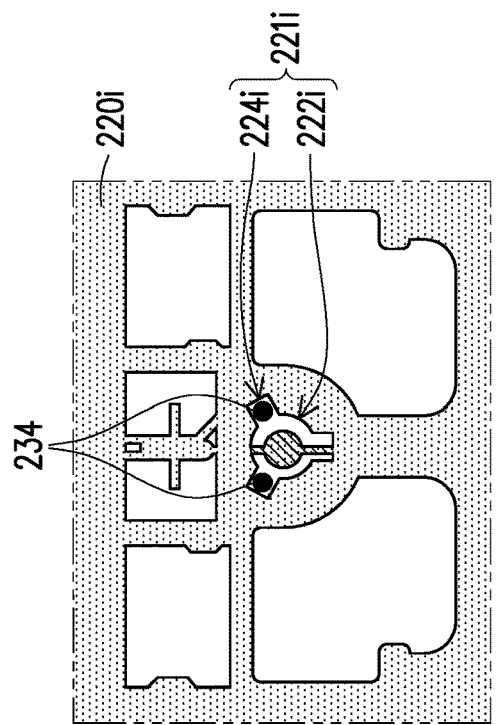

In FIG. 8I, the number of branch regions 224i of a first hole 221i of a bottom plate 220i is three. The two light sources 234 are located in two of the branch regions 224i. The triggering switch 214 is aligned with a central region 222i, and the traces of the triggering switch 214 extend into the last branch region 224i. That is, arrangement positions of the light sources may be determined according to the forms of the bottom plate by the designer, so that the original arrangement of the triggering switch may be prevented from being affected.

In view of the foregoing, the key module provided by the embodiments of the disclosure is provided with the touch member disposed at the key cap, so that dual input options, including pressing and touching, are provided. The circuit layer electrically connected to the touch member is provided with the first opening covered by the key cap, such that the flexible circuit board may pass through the first opening of the circuit layer to extend next to the second surface of the bottom plate. In this way, the flexible circuit board electrically connected to the touch member may not be exposed, and a favorable appearance and a protection effect are thereby provided. In addition, in the embodiments of the disclosure, the bottom plate and the circuit layer of the key module are respectively provided with a first hole and a second hole covered by the key cap. The light source of the backlight assembly is covered by the key cap. The light emitted by the light source passes through the first hole and the second hole and is transmitted toward the key cap, such that the key module may act as an independent light-emitting key module.

Finally, it is worth noting that the foregoing embodiments are merely described to illustrate the technical means of the disclosure and should not be construed as limitations of the disclosure. Even though the foregoing embodiments are referenced to provide detailed description of the disclosure, people having ordinary skill in the art should understand that various modifications and variations can be made to the technical means in the disclosed embodiments, or equivalent replacements may be made for part or all of the technical features; nevertheless, it is intended that the modifications, variations, and replacements shall not make the nature of the technical means to depart from the scope of the technical means of the embodiments of the disclosure.

What is claimed is:

1. A key module, comprising:
    a bottom plate, having a first surface and a second surface opposite to each other;
    a circuit layer having a first opening, disposed on the first surface of the bottom plate;
    a key cap, disposed above the circuit layer;
    a supporting structure, disposed between the bottom plate and the key cap;
    a touch member, disposed at the key cap, wherein the touch member is a capacitive touch member configured to sense finger movement direction and clicking;
    a backlight assembly disposed below the second surface of the bottom plate, wherein the backlight assembly comprises a circuit board, a light source disposed on the circuit board, a light guide plate and a reflection plate; and
    a flexible circuit board, electrically connected to the touch member, passing through the first opening of the circuit layer to extend next to the second surface of the bottom plate, wherein a portion of the flexible circuit board located between the key cap and the bottom plate is bent when the key cap moves downward relative to the bottom plat;
    wherein the light guide plate is located between the circuit board and the reflection plate, the light source is disposed on a surface of the circuit board facing the light guide plate, the circuit board comprises a second hole covered by the key cap, and the light emitted by the light source passes through the second hole, and the first hole after being reflected by the reflection plate.

2. The key module according to claim 1, further comprising a first hole disposed on the bottom plate, wherein the light source is aligned with the first hole of the bottom plate, and light emitted by the light source passes through the first hole.

3. The key module according to claim 2, wherein the first hole comprises a central region and a branch region extending from the central region, the light source is aligned with the branch region of the first hole of the bottom plate, and light emitted by the light source passes through the first hole.

4. A key module, comprising:
- a bottom plate, comprising a first hole, wherein the first hole comprises a central region and at least one branch region extending from the central region;
- a circuit layer, disposed on the bottom plate, comprising a second hole corresponding to the first hole, wherein the circuit layer comprises a triggering switch, and the triggering switch is aligned with the central region of the first hole of the bottom plate;
- a key cap, disposed above the circuit layer, covering the first hole and the second hole;
- a supporting structure, disposed between the bottom plate and the key cap; and
- a backlight assembly, disposed below the bottom plate, comprising a circuit board and at least one light source disposed on the circuit board, wherein the key cap covers the at least one light source, the at least one light source is aligned with the at least one branch region of the first hole of the bottom plate, and light emitted by the at least one light source passes through the first hole and the second hole and is transmitted toward the key cap.

5. The key module according to claim 4, wherein the backlight assembly further comprises a light guide plate and a reflection plate, the light guide plate is located between the circuit board and the reflection plate, the at least one light source is disposed on a surface of the circuit board facing the light guide plate, the circuit board comprises a third hole covered by the key cap, and the light emitted by the at least one light source passes through the third hole, the first hole, and the second hole to be transmitted toward the key cap after being reflected by the reflection plate.

6. The key module according to claim 4, wherein the at least one branch region comprises a plurality of branch regions, the at least one light source comprises two light sources, the two light sources are aligned with two of the plurality of branch regions, respectively.

7. The key module according to claim 6, wherein number of the plurality of branch region is two, three or four.

8. The key module according to claim 4, wherein the at least one branch region comprises a plurality of branch regions, and an included angle between any two adjacent branch regions of the plurality of branch regions ranges between 90° and 180°.

9. The key module according to claim 4, wherein the at least one branch region comprises a plurality of branch regions, the at least one light source is aligned with at least one of the branch regions, and a trace of the triggering switch is aligned with the rest of the branch regions.

10. The key module according to claim 4, wherein a trace of the triggering switch is not aligned with the at least one branch region.

11. The key module according to claim 4, wherein the at least one branch region comprises a branch region, the at least one light source comprises a light source, and the branch region is a sector shaped region.

\* \* \* \* \*